United States Patent [19]

Lanoiselee

[11] Patent Number: 5,077,542
[45] Date of Patent: Dec. 31, 1991

[54] TRANSMISSION SYSTEM WITH SUPPRESSED CARRIER SIGNAL AMPLITUDE MODULATION PRESERVING THE POLARITY OF THE TRANSMITTED SIGNAL, AND CORRESPONDING TRANSMITTER AND RECEIVER

[75] Inventor: Marc Lanoiselee, Thorigne-Fouillard, France

[73] Assignees: L'Etat Francais (CNET), Issy Les Moulineaux; Telediffusion de France S. A., Montrouge Cedex, both of France

[21] Appl. No.: 624,411

[22] Filed: Dec. 7, 1990

[30] Foreign Application Priority Data

Dec. 11, 1989 [FR] France .................. 89 16528

[51] Int. Cl.$^5$ .................. H03C 1/52; H03D 1/02; H04N 5/40
[52] U.S. Cl. .................. 332/151; 332/167; 332/170; 329/348; 329/356; 329/357; 329/360; 455/46; 455/47; 455/70; 455/109; 358/23
[58] Field of Search .................. 332/151–154, 332/167–171; 329/348, 356–358, 360; 455/46, 47, 70, 102, 108, 109; 375/39, 41, 43, 61; 358/23–25

[56] References Cited

U.S. PATENT DOCUMENTS

| | | | |
|---|---|---|---|
| 3,566,036 | 2/1971 | Roche et al. | 455/46 X |
| 3,895,298 | 7/1975 | Schollmeier | 455/46 X |
| 4,618,996 | 10/1986 | Rafal et al. | 455/46 |

Primary Examiner—Siegfried H. Grimm
Attorney, Agent, or Firm—Merchant, Gould, Smith, Edell, Welter & Schmidt

[57] ABSTRACT

A system of transmission with amplitude modulation for the transmission of signals of all types, analog and/or digital, requiring high performance characteristics with respect to the noise induced by the transmission channel, comprising, at transmission, means for the suppressed carrier amplitude modulation of a useful signal and means for the amplitude modulation, in phase quadrature with said modulated useful signal, of a service signal, making it possible, at reception, to remove the ambiguity on the polarity of the demodulated useful signal. Thus it enables the transmission of signals in suppressed carrier modulation mode, hence with a good signal-to-noise ratio, without losing the polarity of the signal. The transmitters and receivers according to the invention also enable the transmission and reception of the signals modulated in SCAM, VSBAM or VSBSCAM modes.

10 Claims, 2 Drawing Sheets

TRANSMISSION SYSTEM WITH SUPPRESSED CARRIER SIGNAL AMPLITUDE MODULATION PRESERVING THE POLARITY OF THE TRANSMITTED SIGNAL, AND CORRESPONDING TRANSMITTER AND RECEIVER

BACKGROUND OF THE INVENTION

1. Field of the Invention

The field of the invention is that of the transmission of all types of signals, analog and/or digital. More precisely, the invention concerns transmission systems with amplitude modulation requiring high performance characteristics with respect to the noise induced by the transmission channel.

The invention can be applied notably, but not exclusively, to the transmission of television signals, irrespectively of their nature and their encoding, on all types of media such as cabled networks, community antennas, radio-frequency broadcasting etc. The invention can also be applied to sound signals and to data signals, especially when a high quality of transmission is required.

2. Description of the Prior Art

The basic principle of amplitude modulation is the multiplication (in the sense of signal processing) of the signal to be transmitted, or primary signal, by a carrier signal, which is sinusoidal for example, having a frequency that is at least twice as high as the maximum frequency of the carrier signal. The resultant of this multiplication, or modulated signal, is received by the demodulator.

In the demodulation, the transmitted signal undergoes a second multiplication by the carrier signal. This is followed by a low-pass type of filtering enabling the useful signal to be recovered.

For this second multiplication, the recovery of the carrier signal at the demodulator can be done almost synchronously, by the filtering and restriction of the received signal. However, this method generates post-filtering distortions. To get rid of these defects, it is possible to carry out a synchronous demodulation, the carrier frequency being recovered by a phase control loop.

In the case of television signals, and more generally in the case of all signals for which it is necessary to know the polarity, the modulation rate does not exceed 100%. This means that the amplitude deflection of the primary signal does not exceed half the amplitude of the high frequency signal obtained after modulation. If not, it is no longer possible to automatically control a phase locking lock at reception to recover the carrier frequency. The result thereof is that the potential of this modulation is under-utilized in terms of noise. For, the greater the modulation rate, the better are the performance characteristics of the modulation.

In a known way, suppressed carrier amplitude modulation (SCAM) corresponds to the limit case of the modulation at a modulation rate of over 100%, wherein the maximum amplitude of the primary signal is equal to the amplitude of the signal obtained after modulation.

The modulated signal then presents phase jumps of 0° to 180° directly related to the zero crossings of the primary signal. The fact that there are as many crossings through 0° as there are through 180° leads to the disappearance of the carrier frequency in the frequency domain. The synchronous demodulation of the signal can therefore no longer be done in a standard way. A particular phase control loop, known as the Costa's loop, is then used. This phase control loop obtains the products of the received signal by the carrier signal reconstituted in phase and in quadrature. The products obtained are applied to the input of the phase comparator of a standard phase control loop.

The periodicity of the Costa's control loop comparator is the periodicity $\pi$, while it is $2\pi$ in the case of a standard demodulator. This leads to the impossibility of determining the polarity of a received signal. The non-recognition of the polarity of the signal has few drawbacks in the case of sound signals and, more generally, when the signal has no low frequencies, but makes it impossible to interpret certain signals, notably television signals.

In short, while the SCAM has a gain (of about 6 dB) in terms of performance characteristics with regard to noise and to interference units as compared with the simple amplitude modulation, and while it requires only little additional power, the loss of the polarity of the signal limits its applications.

Furthermore, there is another known technique of amplitude modulation, namely vestigial sideband amplitude modulation (VSBAM).

Amplitude modulation, whether of the standard type or of the suppressed carrier type, has the further drawback of causing a duplication of the useful frequency spectrum, hence a doubling of the spectral space factor. For a useful spectrum ranging from 0 to $f_c$, and for a carrier frequency $f_p$, the spectrum transmitted will range between the frequencies $f_p - f_c$ and $f_p + f_c$. This spectrum includes two sidebands, on either side of $f_c$, containing the same information.

Vestigial sideband amplitude modulation enables this spectral space factor to be reduced by partially eliminating one of the two sidebands, in such a way that the accurate restoration of the signal remains possible. This can be obtained by Nyquist slope filtering. The lower sideband is then partially eliminated, for example. In this case, it is an infradyne transmission, the modulation frequency $f_p$ being lower than the frequencies of the spectrum transmitted.

VSBAM has the advantage of reducing the spectral space factor by eliminating the redundancies. It is widely used for the transmission of television signals. However, its performance characteristics with respect to noise are limited in the same way as for the standard amplitude modulation as regards the performance characteristics of the SCAM.

It is an aim of the invention, notably, to overcome these drawbacks of the known amplitude modulation techniques.

More precisely, it is an aim of the invention to provide a system of amplitude modulation having characteristics with respect to noise and interference units identical to those of the suppressed carrier amplitude modulation (SCAM) while at the same time preserving the polarity of the transmitted signal.

It is notably an aim of the invention to provide a system such as this, enabling the transmission of signals of any type, digital and/or analog, and especially television signals for which the preservation of polarity is necessary. The invention may be used, for example, for the transmission of signals of the MAC (Multiplexed Analog Components) type.

It is a complementary aim of the invention, in a particular embodiment, to provide a modulation system such as this, with a low space factor, similar to that of the vestigial sideband amplitude modulation (VSBAM).

It is another aim of the invention to provide a modulation system such as this enabling the transmission of information complementary to the useful signal.

It is also an aim of the invention to provide receivers that provide for the reception of signals transmitted in simple vestigial sideband or suppressed carrier amplitude modulation, as well as signals transmitted according to the amplitude modulation technique of the invention.

A complementary aim of the invention is to use the principle of transmission of the invention to enable swift and certain locking into the phase control loop of such receivers.

SUMMARY OF THE INVENTION

These aims, as well as others which shall appear here below, are achieved by means of a system for transmitting a useful analog and/or digital signal, said system having, at transmission, means for the suppressed carrier amplitude modulation of said useful signal and means for the amplitude modulation, in phase quadrature with said modulated useful signal, of a service signal and, at reception, means for the analysis of said demodulated service signal producing a piece of information on the polarity of the demodulated useful signal.

Thus, any useful signal may be transmitted in SCAM mode with the advantages that this gives, notably with respect to noise, without problems as regards its polarity. For, the service signal transmitted conjointly is such that it enables the definition, by analysis, of its sign and, therefore, that of the identical sign of the useful signal.

The sign of the service signal may be determined, for example, by analysis of its dissymmetry if this is known to the receiver, or by standard demodulation if it is modulated with a modulation rate of below 100%.

Advantageously, said means for modulation of said useful signal and/or said service signal comprise vestigial sideband modulation means.

In this way, the invention combines the special advantages of the SCAM and of the VSBAM. It will be seen that the VSBAM notably valuable for the useful signal, which has a wider passband than the service signal.

In one particular embodiment of the invention, said service signal is a continuous signal.

In this case, a simple threshold detection operation on the service signal enables its sign to be determined.

In another advantageous embodiment, said service signal is a signal containing information complementary to the useful signal.

In this case, said service signal is preferably a low-frequency signal, the maximum frequency of which is determined as a function of the level of interference tolerable between the useful channel and the service channel.

Said service signal may also advantageously be a signal correlated with the useful signal so that said pieces of information are transmitted selectively during time intervals, corresponding to instants of transition of said useful signal.

It may notably be a synchronization signal.

Advantageously, said useful signal is a television signal, notably of the type constituted by a time-division multiplexing of analog and/or digital signals.

The invention may thus be applied to the transmission of the signals to MAC standards and, more generally, to all television signals, including high-definition television signals.

In such a system, the transmitter preferably includes means for the attenuation of said modulated service signal with respect to said modulated useful signal.

Indeed, it is desirable that the service signal, the main purpose of which is to remove the ambiguity on the polarity of the useful signal received, should not disturb this useful signal.

The receiver of such a system advantageously includes a phase control loop, of the type called a Costa's loop, means for restoring the demodulated useful signal in direct form and in inverted form and means for selecting one of said restoring means as a function of a piece of information produced by means for analyzing said demodulated service signal.

Preferably, each of the reverse feedback loops of the automatic phase control loop includes bandpass filtering means.

In a preferred embodiment of the receiver of the invention, said phase control loop has a loop filter including an integrator filter and an integral proportional filter.

Advantageously, said receiver includes means for fast locking into said phase control loop, by analysis of said service signal.

Advantageously, said fast locking-in means include loop constant switchover means and an oscillator wobbulating the voltage-controlled oscillator of said phase control loop.

BRIEF DESCRIPTION OF THE DRAWINGS

Other characteristics and advantages of the invention will appear from the following description of a preferred embodiment of the invention, given by way of a non-restrictive illustration, and from the appended drawings wherein.

DESCRIPTION OF A PREFERRED EMBODIMENT

The transmission system of the invention enables the transmission of a signal in suppressed carrier amplitude modulation mode while, at the same time, preserving its polarity. Thus, the transmission can be done with efficient resistance to noise by the signals, without any loss of their sign.

For this purpose, a service signal is transmitted in phase quadrature with the useful signal. The analysis of this second signal at reception makes it possible to determine its sign, and hence the sign of the useful signal, which is identical.

So as to reduce the spectral space factor, the suppressed carrier amplitude modulation may be of the vestigial sideband type, for the useful signal and, as the case may be, for the service signal.

Figure 1:
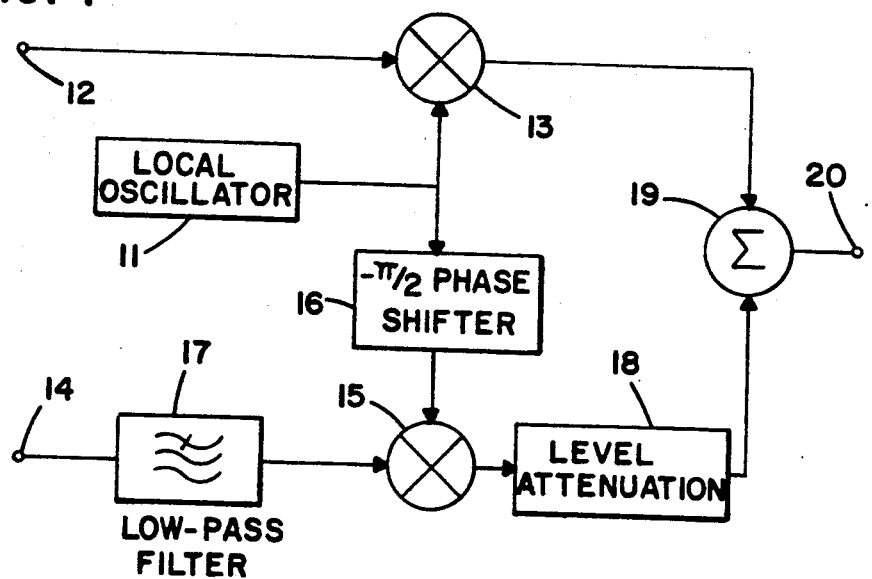
FIG. 1 is a block diagram of a particular embodiment of a modulator according to the invention.

FIG. 1 shows a block diagram of a modulator according to the invention. This modulator has means for amplitude modulation of two channels in phase quadrature.

A local oscillator 11, at the frequency $f_p = w_p/2\pi$ generates a carrier $u_p \cos w_p t$. This carrier modulates the useful signal $12 u_1(t)$, by means of a multiplier 13. The modulation is of the so-called suppressed carrier type.

The service signal 14 $u_o(t)$ is modulated, in phase quadrature with the useful signal, by the carrier $u_p \sin w_p t$, by means of a second multiplier 15. The carrier $u_p \sin w_p t$, is obtained by a $-\pi/2$ phase shift 16 of the signal coming from the local oscillator 11. Should the signal $u_o(t)$ 14 not be correlated with the useful signal 12, it is filtered beforehand by a low-pass filter 17 to restrict the interchannel interference.

The service channel is then subjected to a level attenuation 18, in such a way that it creates the least possible disturbance in the useful signal. Since the priority goal of this service signal is to determine its polarity at reception, its quality is of only little importance in relation to that of the useful signal.

The two signals modulated in phase quadrature are added up by a summator 19. The resultant signal 20 is transmitted.

Figure 2:
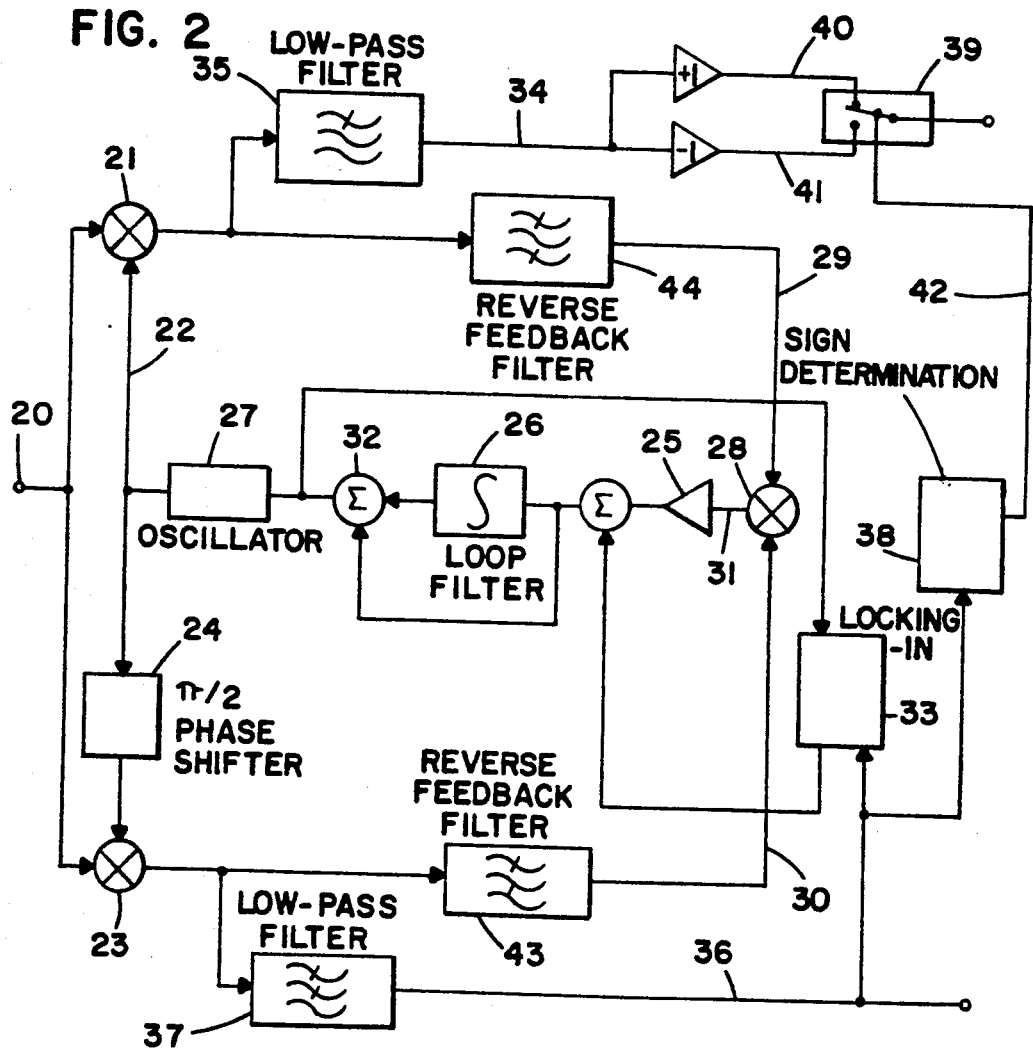
FIG. 2 is a block diagram of a particular embodiment of a demodulator according to the invention.

FIG. 2 is a block diagram of the demodulator according to the invention. The demodulation carrier is reconstituted by means of a phase control loop matched with the SCAM signal and known as a Costa's loop, described in the introduction.

In this demodulator, a multiplier 21 carries out the demodulation of the received signal 20, on the useful channel, by the in-phase reconstituted carrier 22. A second multiplier 23 performs the demodulation of the service, on the service channel, by the same carrier 22, phase-shifted in quadrature by a $\pi/2$ phase-shifter 24.

The reconstituted carrier 22 is generated by the phase control loop including, is a standard way, an amplifier 25, a loop filter 26, a local oscillator 27 and a phase comparator 28.

The phase comparator 28 is constituted by a multiplier which obtains the product of the two demodulated signals 29 and 30. The error signal 31 obtained is then filtered, by the low-pass loop filter 26, in order to average it. The error signal 31 then controls the voltage-controlled oscillator 27 which generates the carrier 22.

The loop filter 26 may be of any type. The highest performance characteristics are obtained by filtering means including an integrator 26 and an integral proportional corrector 32. In this case, the integral proportional corrector 32 provides for the stability of the system as the combination of two integrators (integrator 26 and oscillator 27) creates problems. The integrator filter 26 is preferably one with a high time constant.

The Costa's loop is preferably a second order loop. However, a loop such as this is characterized by excessively long acquisition times in frequency and in phase, requiring a device 33 that facilitates locking-in. This device may be formed by an oscillator, inhibited when the reverse feedback rate becomes sufficient, or a system for switching over the time constant of the loop to different values.

The properties of the service signal also make it possible to obtain an efficient device for locking in the loop. It is constituted by a loop constant switchover system and by an oscillator wobbulating the voltage-controlled oscillator in its frequency range. It is important that this function be put into operation only at the appropriate instants. The service signal gives the locked state of the loop in a stable and reliable way. For example, when this service signal is a continuous level, this level is effectively observed only when the oscillator is matched with the input signal. The reference obtained is independent of the useful signal. This device is therefore insensitive to any possible momentary or periodic occurences of suppression on the useful signal, and to false locking sometimes observed in sampled signals.

Another advantage of this device is that it enables the demodulator to get locked swiftly during the switching-over of the different non-synchronous sources constituted, for example, by the channels of a time-division multiplex.

Since the periodicity of this comparator is smaller than that of a standard amplitude demodulator, the useful channel restores the useful signal 34, plus or minus $\pi$, except for the sign, after low-pass filtering 35. In the case of a video signal, the filter 35 may have, for example, a cut-off frequency of 8 MHz.

The service channel gives the service signal 36, after filtering 37. This low-pass filtering 37 has, for example, a cut-off frequency of 1 kHz. The nature of this service signal 36, if it has been modulated with a modulation rate of less than 100% or, if it has a dissymmetry known to the receiver, makes it possible to remove the indeterminacy of the sign of the demodulation by Costa's loop.

A module 38 for determining the sign drives a change-over switch 39 which enables the selection of the direct filtered output 40 or reverse filtered output 41 of the useful channel.

This module 38 produces a piece of information 42 on the polarity of the received signal. If the service signal has been modulated with a modulation rate of less than 100%, the module 38 carries out its demodulation in a standard way, and then compares the signal obtained with the signal demodulated by the Costa's loop. If they are identical, the direct output 40 is selected, by action on the change-over switch 39. If not, the inverted output 41 is chosen.

The module 38 may also carry out a direct analysis of the service signal received. For example, in the case of a continuous service signal, the module 38 carries out a simple operation for determining the threshold of the received signal, making it possible to determine whether this signal is inverted or not. For instance, the module 38 can be a comparator circuit, the piece of information 42 on the polarity of the received signal corresponding to the direct current recovered on the service channel when it has a sufficient amplitude.

The service channel can also be produced from a synchronization pulse corresponding to a special line of the signal (test line). In receivers, the module 38 is in this case a simple hysteresis comparator.

In the case of a service signal correlated with the useful signal and having a cylic ratio not equal to $\frac{1}{2}$, so as to be not symmetric, the module 38 for determining the sign of the received signal can be made of two peak detectors having low time constants with regard to the signal period. The piece of information 42 on the polarity of the received signal is then produced by a hysteresis comparator.

The transmission system according to the invention also enables the transmission of the signals in vestigial sideband amplitude modulation. Thus, the low spectral space factor advantage of the VSBAM is added on to the advantage of the SCAM of resistance to noise.

Figure 3:
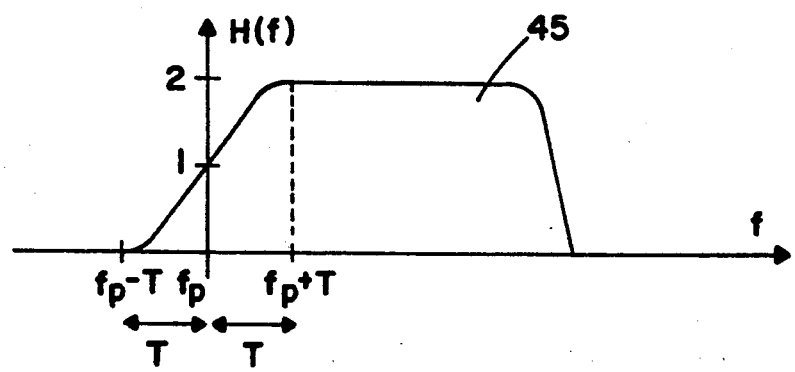
FIG. 3 illustrates the frequency response of a Nyquist slope filter.
Figure 4:
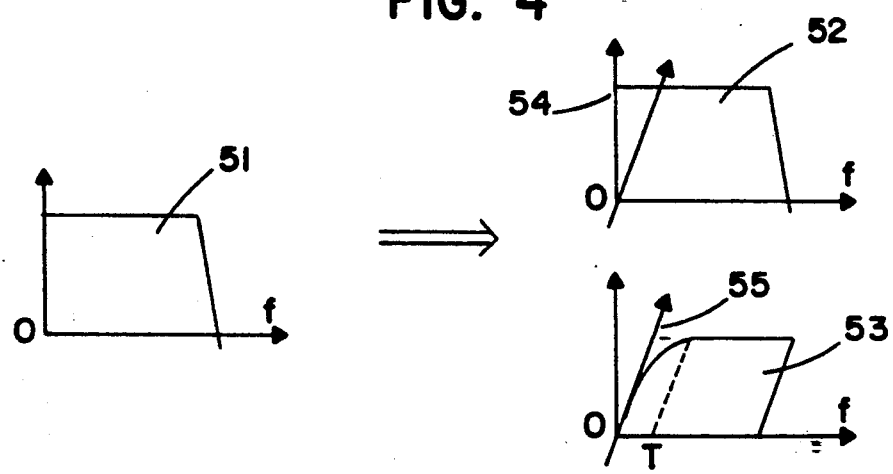
FIG. 4 is a diagram showing the effect of a Nyquist slope filtering operation on a frequency spectrum.

The vestigial sideband modulation is obtained by filtering the modulated signal by a Nyquist slope filter. FIG. 3 shows the frequency response 45 of a filter such as this. A major part of the sideband of the spectrum below the carrier frequency is eliminated. The transfer function of the filter H(f) is defined by:

$$H(f) = 0 \text{ for } f < f_p - T$$

$$H(f) = 1 + \sin(\pi(f - f_p)/2T) \text{ for } f_p - T \leq f \leq f_p + T$$

$$H(f) = 2 \text{ for } f > f_p + T$$

where:
$f_p$: carrier frequency,
T: filter base.

This Nyquist slope filter may be placed either at transmission or at reception of the signal. If it is placed at transmission, it is associated at reception with a channel filter, transparent for the Nyquist filter. Should it be placed at the reception of the signal, it is associated with a band filter at transmission.

The filter 4 shows the effect of a Nyquist slope filtering operation on a spectrum 51 of frequencies ranging from 0 to f. The signal obtained at output of the filter behaves as the sum of two signals 52 and 53 resulting from the modulation of two carriers in quadrature by two identical primary signals for frequencies greater than $f_p + T$ also in phase quadrature. Thus, the frequency spectrum to be transmitted is copied out entirely on the channel in phase 54 and partly on the channel in quadrature 55, the low frequencies, below the shoulder T of the Nyquist slope filter, being attenuated.

The presence of these two signals in quadrature makes a synchronous demodulation obligatory, if the useful signal is to be recovered without distortion.

In standard VSBAM, the component obtained on the channel has a zero mean value. The Nyquist slope filtering operation does not disturb the operation of the demodulation phase control loop in this case. However, the loop low-pass filter is advantageously as steep as possible.

In the transmission system according to the invention, the service signal, transmitted in phase quadrature with the useful signal, is superimposed on the signal in quadrature produced by the Nyquist slope filter.

Furthermore, the influence of this filter is expressed by a low-pass weighting of the gain of the Costa's loop, which becomes null for the frequencies of the useful signal higher than the shoulder T. To overcome these drawbacks, the reverse feedback filters 42 and 43 of the Costa's loop, which in a standard way are of the low-pass type, are advantageously replaced by bandpass filters with a low cut-off frequency that is higher than the maximum frequency of the service signal.

This filter also causes the spectrum of the service signal to be copied out on the useful signal. It is therefore necessary, for a second time, that the spectral occupancy of the service signal should be restricted to the low frequencies. If not, the useful signal will be greatly disturbed by interchannel interference, and the reverse feedback rate of the Costa's band will be insufficient.

This service signal may therefore be either a continuous signal or a low-frequency signal, containing pieces of information complementary to the useful signal. So long as the frequencies remain below the shoulder of the Nyquist slope filter, the problems of interchannel interference are negligible.

However, it is possible to transmit a signal of higher frequency if this signal is correlated with the useful signal. Thus, it is possible to make transmission on the service channel when there is no useful information on the main channel. In the case of X-MAC type (D-MAC, D2-MAC, HD-MAC etc.) signals, it is possible for example to transmit a short digital burst during the transition instants.

Figure 5:
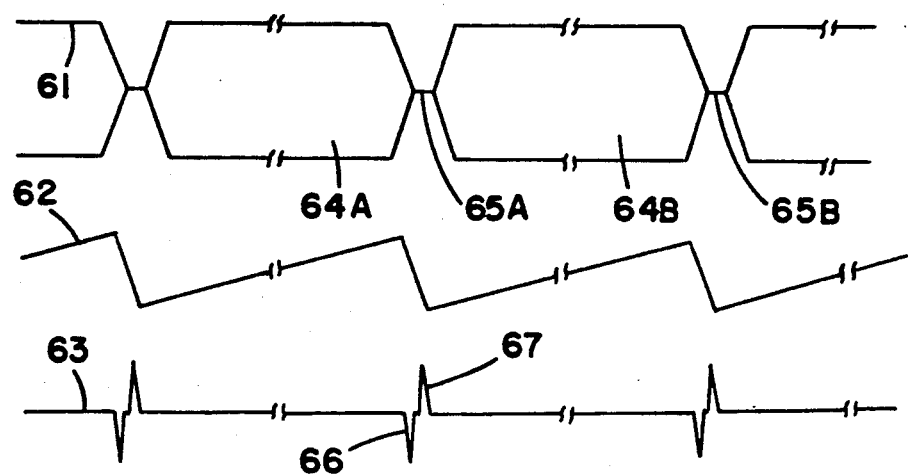
FIG 5. shows an example of signals transmitted, in the case of a D2-MAC type useful signal and of a service signal bearing a synchronization.

Another possibility is to transmit an analog synchronization signal on the service channel. FIG. 5 shows the two channels transmitted in the case of an X-MAC signal 61 and a synchronization signal 62. A signal such as this is transmitted by lines $64_A$ and $64_B$, separated by transition instants $65_A$, $65_B$, or clamp instants. An analog synchronization signal 62 such as this has the advantage of being far more resistant than a digital synchronization signal. The edges of this signal correspond to transition instants of the main signal that have not at all been taken into account. The signal 63 is the signal duplicated on the useful channel. Since the peaks 66, 67 occur only at the transition instants, the useful signal 61 is not disturbed. To make it possible to determine the polarity of the service signal 62, it is necessary for it to be dissymmetrical, should it be modulated in SCAM mode.

In the case of a D2-MAC signal, the device of the invention enables the signal to be transmitted with a gain on the demodulated signal-to-noise ratio of over 6 dB with respect to a 90% amplitude modulation, and with a reduced spectral space factor.

It is thus seen that the system of the invention is highly advantageous for the transmission of analog and/or digital television signals, for example of the D2-MAC or HD-MAC type. However, the invention is not restricted to a particular television system or even to video signals. Any type of signal may be transmitted by this system with high transmission quality, low spectral space factor and fast and solid loop locking in.

Besides, it must be noted that the transmitters and receivers of the invention also enable the transmission and reception of signals in standard SCAM or VSBAM modes.

What is claimed is:

1. A system for the transmission of an analog and/or digital useful signal comprising, at transmission, means for the suppressed carrier amplitude modulation of said useful signal and means for the amplitude modulation, in phase quadrature with said modulated useful signal, of a service signal and, at reception, means for the analysis of said demodulated service signal producing a piece of information on the polarity of the demodulated useful signal.

2. A system according to claim 1, wherein said means for modulation of said useful signal and/or said service signal comprise vestigial sideband modulation means.

3. A system according to claim 1, wherein said service signal is a signal selected from the group consisting of the following signals:
   a continuous signal.
   a low-frequency signal, containing information complementary to the useful signal and having its maximum frequency determined as a function of the level of interference tolerable between the useful channel and the service channel,
   a signal correlated with the useful signal, notably a synchronization signal, containing information complementary to the useful signal transmitted selectively during time intervals corresponding to instants of transition of said useful signal.

4. A system according to claim 1, wherein said useful signal is a television signal, notably of the type constituted by a time-division multiplexing of analog and/or digital signals.

5. A transmitter of a system according to claim 1, including means for the attenuation of said modulated service signal with respect to said modulated useful signal.

6. A receiver of a system according to claim 1, including a phase control loop, of the type called a Costa's loop, means for restoring the demodulated useful signal in direct form and in inverted form and means for selecting one of said direct form and inverted form as a function of a piece of information produced by means for analyzing said demodulated service signal.

7. A receiver according to claim 6, wherein each of the reverse feedback loops of said phase control loop includes bandpass filtering means.

8. A receiver according to claim 6, wherein said phase control loop has a loop filter including an integrator filter and an integral proportional filter.

9. A receiver according to claim 6, including means for fast locking-in said phase control loop, by analysis of said service signal.

10. A receiver according to claim 9, wherein said fast locking-in means include loop constant switchover means and an oscillator wobbulating the voltage-controlled oscillator of said phase control loop.

* * * * *

UNITED STATES PATENT AND TRADEMARK OFFICE
CERTIFICATE OF CORRECTION

PATENT NO. : 5,077,542
DATED : 31 December 1991
INVENTOR(S) : Marc Lanoiselee It is certified that error appears in the above-identified patent and that said Letters Patent is hereby corrected as shown below:

On the Title page, item [73], Assignees, delete "L" in L'Etat.

Column 5, line 33, "service," should read --service signal,--.

Column 6, line 54 delete "cylic" and insert --cyclic--.

Colum 7, line 6 delete "$\leq f \geq$" and insert --$\leq f \geq$--.

Signed and Sealed this

Twentieth Day of July, 1993

Attest:

MICHAEL K. KIRK

*Attesting Officer*     *Acting Commissioner of Patents and Trademarks*